United States Patent [19]
Yamashita et al.

[11] Patent Number: 5,712,792
[45] Date of Patent: Jan. 27, 1998

[54] LOGIC CIRCUIT SYTHESIZING METHOD UTILIZING BINARY DECISION DIAGRAM EXPLORED BASED UPON HIERARCHY OF CORRELATION BETWEEN INPUT VARIABLES

[75] Inventors: Shunzo Yamashita, Tokyo; Kazuo Yano, Hino; Yasuhiko Sasaki, Koganei; Koichi Seki, Hino, all of Japan

[73] Assignee: Hitachi, Ltd., Japan

[21] Appl. No.: 633,486

[22] Filed: Apr. 17, 1996

[30] Foreign Application Priority Data

Apr. 21, 1995 [JP] Japan .................................. 7-096487

[51] Int. Cl.$^6$ .................................................. G06F 17/50
[52] U.S. Cl. ............................................ 364/489; 364/488
[58] Field of Search .................................. 364/488, 489, 364/490

[56] References Cited

U.S. PATENT DOCUMENTS

| | | | |
|---|---|---|---|
| 4,792,909 | 12/1988 | Serlet | 364/488 |
| 5,243,538 | 9/1993 | Okuzawa et al. | 364/489 |
| 5,331,568 | 7/1994 | Pixley | 364/489 |
| 5,461,574 | 10/1995 | Matsunaga et al. | 364/489 |
| 5,469,367 | 11/1995 | Puri et al. | 364/489 |
| 5,493,504 | 2/1996 | Minato | 364/488 |
| 5,513,122 | 4/1996 | Cheng et al. | 364/489 |

FOREIGN PATENT DOCUMENTS 4-112270  4/1992  Japan.

OTHER PUBLICATIONS

Information Processing Society of Japan, Journal of Information Processing, vol. 34, No. 5, May 1993, pp. 593–599.
Information Processing Society of Japan, Proceedings of 1994 Autumn National Conference, vol. A, p. 64.
Proceedings of IEEE 1994 Custom Integrated Circuits Conference, 1994, pp. 603–606.
IEEE Transactions on Computers, vol. C-35, No. 8, August, 1986, pp. 677–691.
Proceedings of the Information Processing Society 44th National Congress, pp. 6-143 to 6-144.

Primary Examiner—Vincent N. Trans
Attorney, Agent, or Firm—Fay, Sharpe, Beall, Fagan, Minnich & McKee

[57] ABSTRACT

In order to effectively explore a binary decision diagram for synthesizing a logic circuit, a tentative circuit comprised of AND gates and OR gates is synthesized from a logic function. The number of gates in this circuit to which two input variables are simultaneously associated are counted and used as correlation between the two input variables. A correlation matrix for correlation among all of the input variables is generated. The input variables are sequentially grouped from a set of input variables with strongest correlation in the correlation matrix: These groups are registered into a correlation tree, and an intergroup correlation tree is produced. These groups are sequentially selected from a group with the least correlation, and the intragroup order of the selected group is changed from one to another. A binary decision diagram is explored which satisfies the most appropriate condition in that group (such as the minimum number of nodes, the minimum delay, and the minimum area). The above processes repeated for all groups. Each node of the binary decision diagram thus obtained is substituted by a selector and each selector circuit is substituted by a circuit of a transistor level.

33 Claims, 13 Drawing Sheets

FIG. 3

110 INTERGROUP CORRELATION TREE MAKING ROUTINE

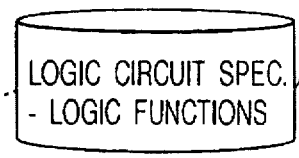
LOGIC CIRCUIT SPEC. - LOGIC FUNCTIONS — 10

111 TENTATIVE SYNTHESIS OF A CIRCUIT BY REMOVING LOGICAL REDUNDANCY

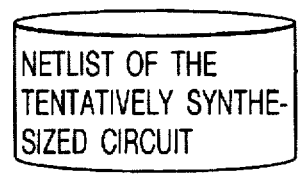
NETLIST OF THE TENTATIVELY SYNTHE-SIZED CIRCUIT — 22

112 CREATE INTERGROUP CORRELATION MATRIX
COUNT THE NUMBER OF GATES ASSOCIATED WITH TWO INPUT VARIABLES SIMULTANEOUSLY, CALCULATE THE DEGREE OF CORRELATION BETWEEN THESE VARIABLES AND REGISTER IT IN THE CORRELATION MATRIX. REPEAT ABOVE OPERATIONS FOR ALL OF SETS OF INPUT VARIABLES

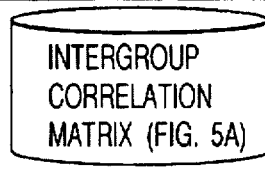
INTERGROUP CORRELATION MATRIX (FIG. 5A) — 23

113 CREATE INTERGROUP CORRELATION TREE

114 GROUP A SET OF INPUT VARIABLES MOST CORRELATIVE AND REGISTER A NODE CORRESPONDING TO THAT GROUP INTO CORRELATION TREE

115 MODIFY THE CORRELATION MATRIX BY USING THE GROUPED SET OF INPUT VARIABLES AS AN INPUT VARIABLE

REPEAT ABOVE OPERATIONS UNTIL NO SET OF INPUT VARIABLES TO BE GROUPED REMAINS

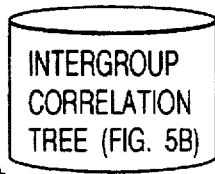
INTERGROUP CORRELATION TREE (FIG. 5B) — 20

END

FIG. 4
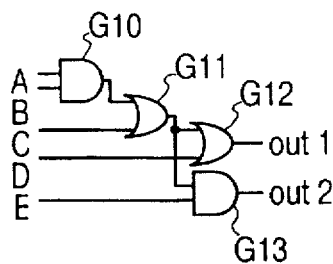
FIG. 5A
INTERGROUP CORRELATION MATRIX
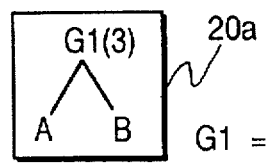
FIG. 5B
INTERGROUP CORRELATION TREE
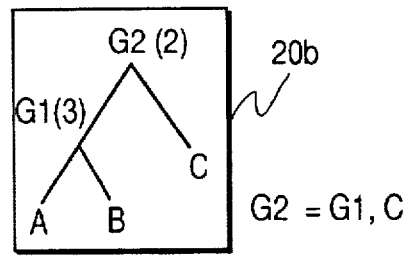
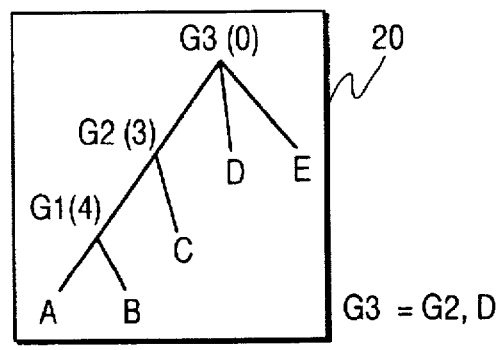

| BINARY DECISION DIAGRAM |  |
|---|---|
| ORDER OF INPUT VARIABLES | E, D, B, A, C |
| DELAY | DELAY OF INPUT B + DELAY OF TWO STAGES OF TRANSISTORS + LOAD DELAY OF OUT1 (LOAD DELAY OF OUT2) |

LOGIC CIRCUIT SYTHESIZING METHOD UTILIZING BINARY DECISION DIAGRAM EXPLORED BASED UPON HIERARCHY OF CORRELATION BETWEEN INPUT VARIABLES

BACKGROUND OF THE INVENTION

The present invention relates to a logic circuit synthesis method utilizing binary decision diagram based on logic functions defining a logic circuit to be synthesized.

A binary decision diagram has many variations. Basically, the binary decision diagram is an expression of logic functions by a binary decision tree having two edges, 0-edge and 1-edge, and has a characteristic that it can express a complex logic function concisely. For example, refer to Information Processing Society of Japan, Journal of Information Processing vol. 34, No. 5, May 1993, pp. 593–599 (referred to a reference one hereinafter). Owing to this feature, there have been recently increased examples of a binary decision diagram applied to the logic verification or to the logic circuit synthesis. For the application to the logic synthesis, Information Processing Society of Japan, Proceedings of 1994 Autumn National Conference, vol. A, p. 64 (hereinafter referred to a reference 2), or Proceedings of IEEE 1994 Custom Integrated Circuits conference, 1994, pp.603–606 (hereinafter referred to a reference 3) discloses methods for substituting a node in a binary decision diagram with a two-input one-output selector circuit. U.S. Pat. No. 5,243,538 (hereinafter, reference 4) discloses application of a binary decision diagram to logic verification.

More specifically, the reference 2 or 3 suggests automatic logic circuit synthesis method for synthesizing a compact logic circuit having less transistors, by substituting nodes in a binary decision diagram by pass transistor type selector circuits comprised of N type FETs (field effect transistors) and by further inserting buffer circuits for current amplification, if necessary. Since such methods of synthesizing a logic circuit by using a binary decision diagram, substitute nodes in a binary decision diagram with selector circuits, a more compact logic circuit may be synthesized with a smaller number of transistors, in general, if a binary decision diagram with sufficiently fewer nodes may be determined. Also, a compact logic circuit has relatively small delay. Therefore, it is important to determine an order of input variables so as to minimize a total number of nodes in a binary decision diagram.

It is known that a total number of nodes in a binary decision diagram is significantly dependent on an order of input variables used in constructing the binary decision diagram. For example, see IEEE Transactions On Computers, vol. C-35, No. 8, August 1986, pp.677–691 (hereinafter referred to as a reference 5).

When a total number of input variables is very small, then it may be possible to make binary decision diagrams for all possible patterns of the order of input variables and select one with a minimum number of nodes (exhaustive exploration). However, this method is not realizable because if applied to a general logic function having more than one hundred input variables, the number of the patterns to be explored will become astronomical. In addition, it is known that it is impossible to find in an analytical manner an order of input variables which will produce a binary decision diagram with the minimum number of nodes for a given logical function in a strict sense of the word. For example, see reference 5. In general, the binary decision diagram has the following characteristics:

1-1: a binary decision diagram having a smaller number of nodes may be obtained when input variables connected to the same gate in a circuit are positioned nearer within the order of input variables.

1-2: a binary decision diagram having a smaller number of nodes may be obtained when an input variable which has a stronger power for controlling an output of a circuit portion, such as a control signal input of a selector circuit, is positioned nearer the roots of a binary decision diagram to be made.

Accordingly, there are several methods suggested which synthesize a circuit tentatively from a logical function, and determine the order of input variables on the basis of the circuit connection information so as to satisfy the above conditions 1-1 and 1-2.

As an example, a method of determining the order of input variables shown below is described in Proceedings of the Information Processing Society, 44th National Congress, pp. 6–143 to 6–144 (hereinafter referred to a reference 6):

2-1: defining a level to each gate. The level here indicates the maximum number of stages of gates among various numbers of stages of gates which various paths from an input terminal to that gate have.

2-2: dividing input variables into subgroups such that input variables which are inputted directly or indirectly to a group of gates of a higher level, belong to the same subgroup.

2-3: determining the order between subgroups such that a subgroup having a more number of gates to which input variables of the subgroup are directly or indirectly connected will be placed further away from the roots of a binary decision diagram which will be generated later on.

2-4: repeating steps 2-1 through 2-3, by decreasing a level of a gate group of interest until the order of all the input variables is decided.

The possibility that subdiagrams in a binary decision diagram which will be generated later on may be shared by plural outputs will increase due to the step 2-3. With increased sharing of subdiagrams, a binary decision diagram of a smaller number of nodes may be obtained for a general logical function with multiple outputs.

In Japanese Laid-Open Patent Application No. Hei 4-112270 (hereinafter referred to a reference 7), another method of deciding the order of input variables is disclosed as follows:

3-1: constructing a binary decision diagram by deciding a tentative order of input variables.

3-2: locally modifying the order of adjacent input variables, if this modification decreases the number of nodes. Restoring the order to the original one if the modification does not decrease the number of nodes.

3-3: repeating the step 3-2, until no further decrease of the number of nodes does occur.

In this method, the order of input variables is modified such that the number of nodes decreases, after a binary decision diagram has been constructed. Therefore, a binary decision diagram can be obtained without a fail, which has a smaller number of nodes than the original binary decision diagram. By applying other methods together with this method, a binary decision diagram with a further smaller number of nodes may be obtained.

SUMMARY OF THE INVENTION

The inventors of the present invention have studied the relationship between the orders of input variables and the sizes of logic circuits obtained for them. In that study, the inventors decided a binary decision diagram for each of several logic functions, then assigned logic circuits to the binary decision diagrams, by applying the methods disclosed in the reference 2 or 3. As a result, the inventors found that a very compact logic circuit having a very small number of transistors was obtained for one logic function, while the number of transistors increased significantly for another logic function. Also the inventors found that there are many cases where different orders of input variables for the same logical function resulted in synthesized circuits with the numbers of transistors being different by several times.

When the inventors of the present invention studied the method for determining the order of input variables as described in the reference 6, it became clear that there are many cases in which a binary decision diagram of a smaller number of nodes could not be constructed based on the order of input variables determined according to the method, and therefore, a compact logic circuit could not be synthesized. This indicates that the simple order decision rule of this method (see the process of the prior art, 2-3) may select a binary decision diagram the number of nodes of which may not always be decreased.

When the present inventors studied the method of reference 7, there were many cases where a compact logic circuit could not be synthesized, because a final result obtained changed a lot depending upon the tentative order of input variables employed.

As stated above, methods of deciding the order of input variables of the prior art cannot determine the order of input variables for generating a binary decision diagram of a sufficiently smaller number of nodes for a variety of logic functions. As a result, the prior art methods have problems that logic circuits of a small size or small delay are not always synthesized.

Thus, in order to synthesize a logic circuit by using a binary decision diagram, it is important at first to establish a method of deciding the order of input variables so as to be able to generate a binary decision diagram of a sufficiently small number of nodes.

However, according to the studies by the present inventors, there are still problems that simply deciding a binary decision diagram of a small number of nodes is not enough to synthesize logic circuits, by using binary decision diagrams, which are further smaller in size, or which are excellent regarding characteristics such as delay or power consumption.

This indicates that, in general, a logic circuit synthesized by a binary decision diagram of a sufficiently small number of nodes may have a number of transistors, an area and delay which are respectively almost the minimum. However, this method has difficulty in synthesizing a logic circuit of a smaller size or less delay than such an obtained logic circuit.

For example, when a logic circuit obtained by substituting nodes of the binary decision diagram by selectors is not sufficient and a buffer needs to be inserted in the logic circuit for current amplification, as stated in the reference 2 or 3, the area of the logic circuit obtained from the above mentioned method will not become sufficiently small even though a diagram of a sufficiently small number of nodes is used as the binary decision diagram. Furthermore, the inventors found that a logic circuit of a smaller size was obtained by inserting the buffer after substituting the nodes of another binary decision diagram of which the number of nodes is a little larger than the binary decision diagram of the sufficiently small number of nodes.

This fact also applies to the delay. The inventors found that a logic circuit of optimized combination of an area and delay, or of optimized combination of an area, delay and power consumption, could be obtained by using a binary decision diagram of a larger number of nodes than the binary decision diagram of an approximately minimum number of nodes.

Other logic circuit synthesis methods of the prior art not using a binary decision diagram often employ a method in which a logic circuit is first synthesized by predetermined steps, and if the delay or the size of the circuit exceeds a target range, the circuit is modified so as to make the delay on the size falls within the target range. It is often inefficient to apply this method to a logic circuit synthesized by using a binary decision diagram having a number of nodes different from a preferred number of nodes. That means that the characteristics of a logic circuit synthesized by using a binary decision diagram, such as a size and delay, may depend largely on the shape of the diagram and the number of nodes. A desired result may not be achieved even if a logic circuit synthesized by using a binary decision diagram of a non-optimized number of nodes is modified after synthesis.

Therefore, an object of the present invention is to provide a logic circuit synthesis method suitable for synthesizing a logic circuit by using a binary decision diagram, which efficiently explores a binary decision diagram which satisfies a desired condition based on the given logic function.

More specifically, an object of the present invention is to provide a logic circuit synthesis method suitable for synthesizing a logic circuit using a binary decision diagram, which efficiently explores a binary decision diagram having a sufficiently small number of nodes based on a given logic function.

Another object of the present invention is to provide a logic circuit synthesis method suitable for synthesizing a logic circuit by using a binary decision diagram, which synthesizes a logic circuit which is more suitable in the characteristics such as a size, delay, and power consumption, or combination thereof.

Still another object of the present invention is to provide an optimizing method of a binary decision diagram suitable for efficiently exploring, based on a given logic function, a binary decision diagram of a sufficiently small number of nodes that is suitable for use in a variety of applications such as logic circuit synthesis or logic verification described in the reference 4 above.

To achieve the objects, the method of the present invention first detects hierarchical structure of correlation between a group of input variables, then explores preferred values of partial orders of input variables belonging to respective levels of the hierarchy sequentially from a relatively lower correlation level.

Combination of partial orders decided by the above steps is used as a preferred order for a group of input variables and a logic circuit is synthesized from a binary decision diagram corresponding thereto.

In a preferred mode of the method of calculating correlation between input variables, a tentative logic circuit comprised of simple gates is synthesized as a logic circuit performing a logic function designated. A correlation between a set of input variables, a total number of gates is counted that a set of signals corresponding to the set of input variables simultaneously pass through within the logic circuit. As such, a correlation table having correlations between different input variables as elements is generated and a group of input variables of the strongest correlation are selected as members of the lowest group. Then, the correlation that other input variables have for this group is calculated based on the logic functions. One or a plurality of input variables of the strongest correlation to this group and this group are selected as members of the second lowest group. Thereafter, the above steps are iteratively repeated. Thus, a correlation tree is completed which has nodes representing the group of input variables and a plurality of groups as generated. This tree is used as data indicating the hierarchical structure of the group of input variables.

In a concrete mode of exploration of the suitable order of a group of input variables, a suitable order of members (group or input variable) of highest level is explored at first for the hierarchical structure thus obtained. The exploration uses predetermined intragroup orders for other groups. For exploration of an intragroup order suitable for groups of the highest level, one of possible intragroup orders is selected, then a binary decision diagram for the logic function is generated for the selected intragroup order and the binary decision diagram is evaluated in terms of a predetermined criterion. For example, the number of nodes is counted. This step is repeated for the possible intragroup orders. This repetition is used to detect an intragroup order which satisfies a desired condition such as one which will generate a binary decision diagram with a small number of nodes among a plurality of intragroup orders possible for this group. The exploration for other groups thereafter uses this selected intragroup order for that group.

Then, a suitable intragroup order for members of the second level is explored in a similar way. This operation is iteratively repeated until an intragroup order for the lowest group is decided.

In a concrete mode for generating a logic circuit, an order of input variables determined by the sequentially defined intragroup orders for the groups as described above is used as a preferred order for the group of input variables. The logic circuit is generated by mapping each node of the binary decision diagram corresponding to the preferred order into a unit circuit, more preferably, a selector circuit.

The above mentioned method may be used for other applications than the logic circuit synthesis, such as when the binary decision diagram is used for logic verification. In such a case, the process up to the portion determining a suitable binary decision diagram in the above steps is used for optimization of the binary decision diagram.

Another preferred mode of the present invention is more suitable for generating a logic circuit having a more suitable value for a predetermined circuit characteristics than a binary decision diagram of a smaller number of nodes as stated above. That is, when exploring an order of input variables, a logic circuit is synthesized based on the binary decision diagram corresponding to the explored order and its circuit characteristics is calculated. The calculation results are used to exploring an order of input variables which will generate a logic circuit having more suitable characteristics.

More specifically, this exploration is executed by modifying the method as described first that generates a binary decision diagram and uses it for exploring a suitable intragroup order. That is, a logic circuit is synthesized by using a binary decision diagram generated for a candidate intragroup order, the value of a circuit characteristics of that circuit is calculated, and an intragroup order which will produce a more suitable value of circuit characteristics is explored for each group. By this, even though the number of nodes of the generated binary decision diagram is not minimum, an intragroup order which will produce the most suitable the value of the characteristics is chosen for each group. By performing such exploration in a way similar to the method as described first, the order of the group of input variables is decided for synthesis of a logic circuit having preferred values for the circuit characteristics and a suitable logic circuit is generated by using this order. Examples of the circuit characteristics are an area, delay, power consumption or combination of them.

BRIEF DESCRIPTION OF THE DRAWINGS

FIG. 3 is a flow chart showing an intergroup correlation tree generating routine used for the logic circuit synthesis program shown in FIG. 1;

FIG. 4 is an exemplary circuit diagram of a tentatively synthesized circuit as generated by the intragroup correlation tree generating routine shown in FIG. 3;

FIG. 5a is a schematic diagram indicating an intergroup correlation matrix generated by the intragroup correlation tree generating routine shown in FIG. 3 and a process of modification thereof;

FIG. 5b is a schematic diagram explaining a process generating an intergroup correlation tree by an intergroup correlation matrix;

FIG. 10b is a transistor level circuit diagram synthesized when selectors of the logic circuit of FIG. 10a are realized by the pass transistor type selectors structured from the N-type FET shown in FIG. 9a;

FIG. 12a shows an exemplary, binary decision diagram generated by the optimized binary decision diagram generating routine shown in FIG. 11;

FIG. 12b is a transistor level circuit diagram for the binary decision diagram of FIG. 12a;

DETAILED DESCRIPTION OF THE PREFERRED EMBODIMENTS

Figure 1:
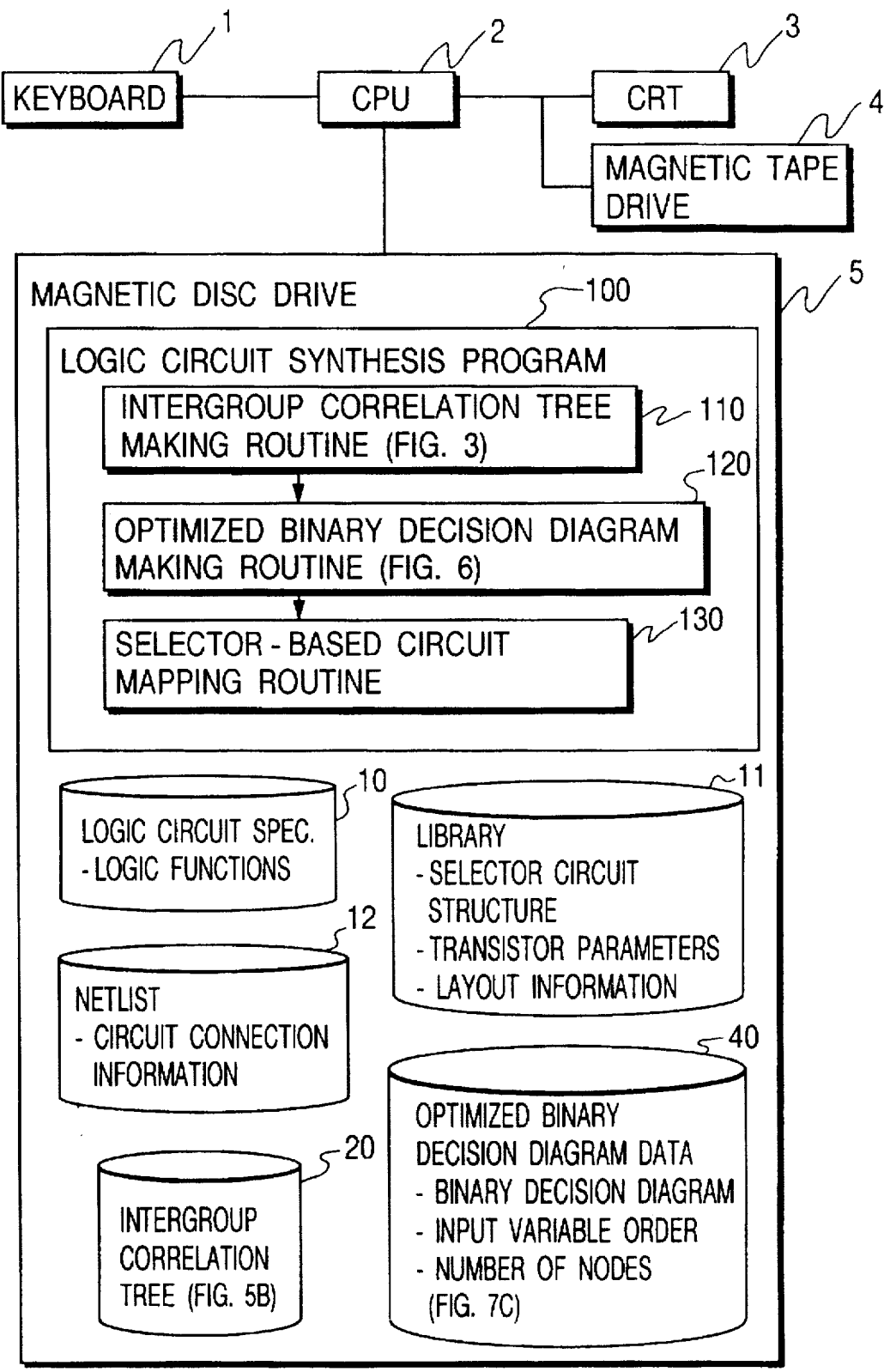
FIG. 1 is a schematic diagram of a computer system used for synthesis of a logic circuit and a logic circuit synthesis program used therein, according to the first embodiment of the present invention.

The method of logic circuit synthesis according to the present invention will be described in greater details hereinbelow with reference to several embodiments shown in the appended drawings. The same reference numeral designates the same or similar parts herein.

[The first embodiment]

In this embodiment the functional specification of the logic circuit to be designed is used for manufacturing a semiconductor integrated circuit comprising that logic circuit. In the synthesis of the logic function in this manufacturing process a binary decision diagram of a small number of nodes is efficiently explored and is used for logic circuit synthesis.

(1) Overview of the system

Figure 2:
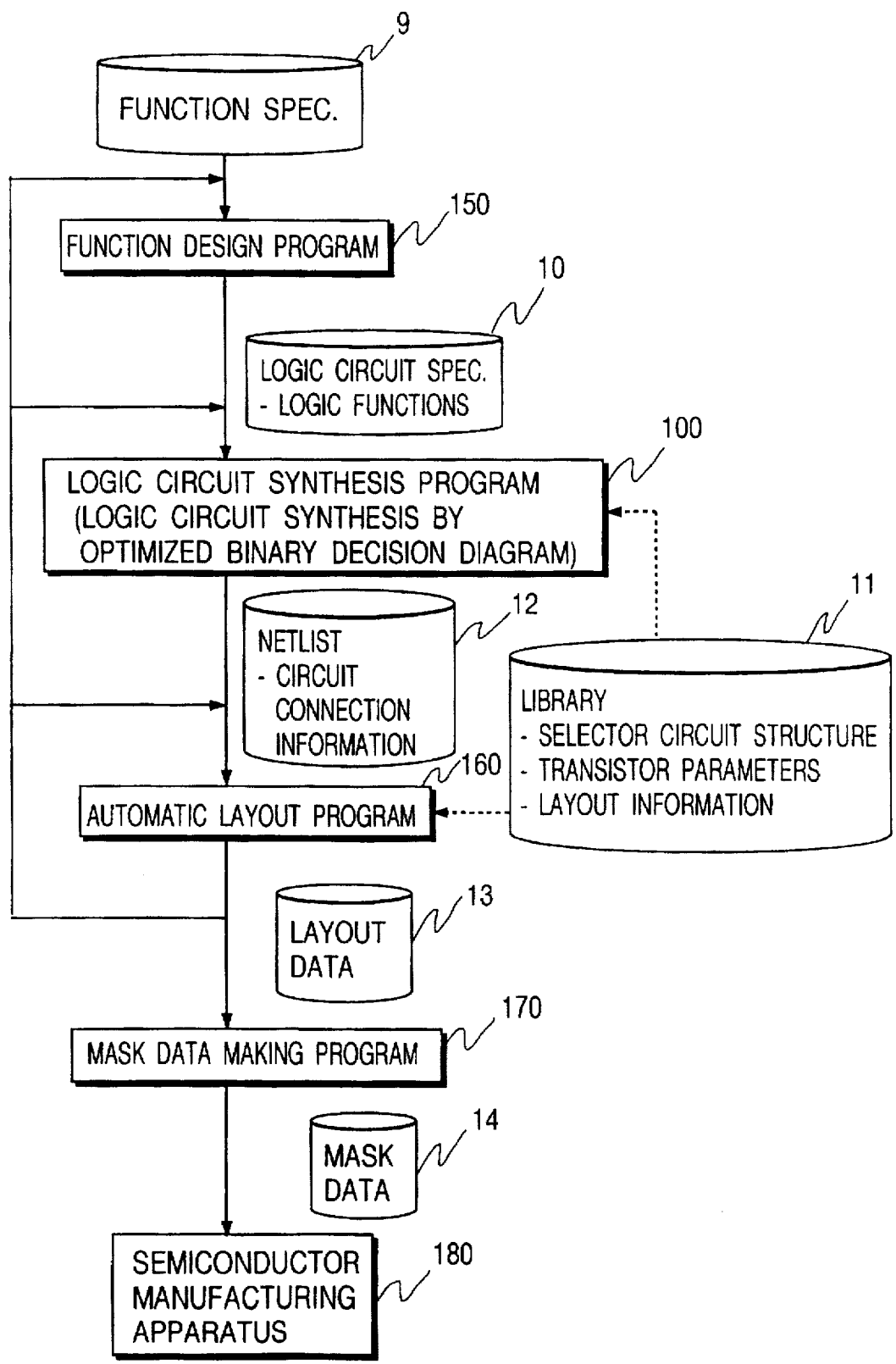
FIG. 2 is a flow chart from function designing to manufacturing of a semiconductor integrated circuit according to the first embodiment of the present invention.

Referring to FIG. 2, a designer inputs the function specification 9 of the semiconductor integrated circuit of interest. A function designing program 150 generates more concrete logic circuit specification 10 from the function specification 9. The logic circuit synthesizing program 100 specific to the present embodiment synthesizes a logic circuit realizing the logic function specified by the logic circuit specification 10 from the logic circuit specification 10 and generates connection information of that circuit (referred to as a netlist in general). Automatic layout program 160 refers to a library 11 based on the netlist 12, determines the most suitable layout for the logic circuit, and generates layout data 13. A mask data generating program 170 in turn determines a plurality of mask patterns for manufacturing the synthesized logic circuit by using integrated circuit technology, then generates mask data 14 indicating these mask patterns. A semiconductor manufacturing apparatus 180 uses the mask data 14 to manufacture the semiconductor integrated circuit having required functions. Each of programs 150, 100, 160, and 170 is executed on different computers assigned thereto. It is needless to say that these programs may run on the same computer.

FIG. 1 shows an overview of the computer system for executing the logic circuit synthesizing program 100 and the program itself. This computer system comprises input devices such as keyboard 1, a central processing unit (CPU) 2, a display device (CRT) 3, a magnetic tape drive 4, and a magnetic disk drive 5 storing the logic circuit synthesizing program 100. The logic circuit synthesizing program 100 is comprised of an intergroup correlation tree generating routine 110, an optimized binary decision diagram generating routine 120, and a selector-based circuit mapping routine 130. These programs are loaded from the magnetic disk drive 5 to the CPU 2 by instructions inputted by the designer through the keyboard 1 and are executed there. The program 100 synthesizes a logic circuit of a logic gate level, which satisfies the logic circuit specification 10 supplied from the user, and generates a circuit of a transistor level, by using the logic circuit of a gate level and the library 11. The netlist 12 including information on this circuit is passed to the automatic layout program 160 of FIG. 2 via the magnetic tape drive 4. Intermediate or final data generated by the execution of the logic circuit synthesizing program 100 or used by the program 100 is stored in the magnetic disk drive 5 or the random access memory (RAM) in the CPU.

In this preferred embodiment, the logic circuit synthesizing program 100 uses a method of synthesizing a logic circuit by using a binary decision diagram. That is, for a plurality of input variables and at least one output variable respectively indicating a plurality of input signals and at least one output signal of a logic circuit to be synthesized, a binary decision diagram is explored which is suitable for synthesizing a logic circuit satisfying the logic function described in the logic circuit specification 10, and data 40 indicating the diagram is generated. Further, based on the data 40, the diagram is mapped to a logic circuit of a selector level, then the logic circuit is converted to a logic circuit of a transistor level by using the library 11.

One of the features of the present embodiment is that the exploration is efficiently performed, more specifically, the correlation among these input variables is calculated, according to which the input variables are grouped into a plurality of hierarchical groups, a correlation tree 20 indicating the hierarchy of these groups is generated, and the tree is used for exploring an intragroup order most suitable in the order starting from the highest (less correlative) group. Thus suitable binary decision diagram for use in synthesis of a logic circuit which satisfies the logic function is explored efficiently. Each of the routines will be described hereinbelow.

(2) Intergroup correlation tree generating routine 110

The intergroup correlation tree generating routine 110 generates the intergroup correlation tree 20 from the logic circuit specification 10. The logic circuit specification 10 comprises a logic function on a plurality of input variables and at least one output variable indicating respectively a plurality of input signals and at least one output signal of the logic circuit to be synthesized, and other information. In the following description the present embodiment will be explained by using an example of the logic function given below:

out1=AB+C+D, out2=(AB+C)E

Referring now to FIG. 3, the redundancy of the logic function is removed from the logic function specified by the logic circuit specification 10, then a logic circuit using AND gates and OR gates is tentatively synthesized (111), and a netlist 22 is generated for the logic circuit tentatively synthesized. In case of the logic function as shown above, the circuit shown in FIG. 4 is tentatively synthesized. The tentatively synthesized logic circuit is used to determine correlation between input variables in the manner explained below. If the tentatively synthesized logic circuit is redundant, the correlation between input variables may or may not be accurately evaluated. Thus, it is important to remove redundancies as much as possible. Also, removing redundancy enables a more suitable binary decision diagram to be explored. The process of removing redundancy on the logic function and the tentative synthesis of a circuit may be performed by using the existing known logic circuit synthesizing tools.

Next, an intergroup correlation matrix 23 is generated from the tentatively synthesized logic circuit (112). The correlation between two input variables is calculated by counting a number of gates simultaneously associated with two input variables in the tentatively synthesized logic circuit, and this correlation is registered in the intergroup correlation matrix 23. When considering the correlation between two input variables A and B in the embodiment of FIG. 4, the gates concerning the input variables A and B are four gates G10 to G13. This indicates that the correlation between the input variables A and B is four. This correlation is registered in the intergroup correlation matrix 23. Also, the gates concerning the input variables A and C are three gates G11 to G13, and correlation between the two input variables is three. This correlation is registered in the intergroup correlation matrix 23. The correlation between remaining all input variables is determined in the similar way, and the intergroup correlation matrix 23 is completed.

The correlation between input variables thus defined indicates that stronger correlation between two input variables implies more number of gates are simultaneously connected to these two input variables. From the characteristics of the binary decision diagram stated in 1-1 of the prior art, a set of input variables strongly correlated with each other has to be placed nearer to each other in the order of input variables, if a binary decision diagram of a smaller number of nodes is to be generated. A set of input signals of weak correlation or no correlation is not necessarily to be placed near to each other in the order of input variables.

Next, an intergroup correlation tree 20 is produced from the intergroup correlation matrix 23 (113). More specifically, a set of the most strongly correlating input variables in the intergroup correlation matrix 23 is grouped and a node corresponding to these input variables is generated on the intergroup correlation tree (114). In the present example, the correlation between input variables A and B is the strongest, so that a group G1 is generated having A and B as members, and the node corresponding to the group G1 is registered into the intergroup correlation tree 20a (FIG. 5). Then the intergroup correlation matrix 23 is modified by considering the input variables grouped into the group G1 as one new input variable (115). The processes 114 and 115 are iteratively repeated until there is no set of input variables to be grouped. The input variables not grouped are registered in the highest node in the intergroup correlation tree. In the present example shown in FIG. 5, the group G1 having A and B as members, becomes a new input variable, and the intergroup correlation matrix 23 of FIG. 5A will be modified to the matrix 23a. In the intergroup correlation matrix 23a, the correlation between G1 and C is three, then G1 and C are grouped into a new group G2, and this group G2 is registered in the intergroup correlation tree 20b. The intergroup correlation matrix 23b is modified to obtain a new intergroup correlation matrix 23b. In the intergroup correlation matrix 23b, the correlation between the group G2 and input variable D, and the correlation between the group G2 and the input variable E are both 1. There is no correlation between D and E (correlation 0), which are not to be grouped. Accordingly, G2, D, and E are registered into the highest node in the intergroup correlation tree. The final correlation tree is thus obtained.

Although in the above example there is only one set of input variables which are strongly correlated, there may be a logical function for which it occurs that input variables are grouped into plural sets of input variables, these sets have approximately similar correlation but there are weak or no correlation between two sets within the sets. In such a case, these sets of input variables are independently grouped into separate groups.

If there are input variables between which there is no correlation, a node having them as members will be generated at the highest level of the intergroup correlation tree.

(3) Optimized binary decision diagram generating routine 120

The optimized binary decision diagram generating routine 120 generates an optimized binary decision diagram data 40, from the previously generated intergroup correlation tree 20 and the logic circuit specification 10. The data is comprised of a binary decision diagram, the order of input variables, and the number of nodes.

Figure 6:
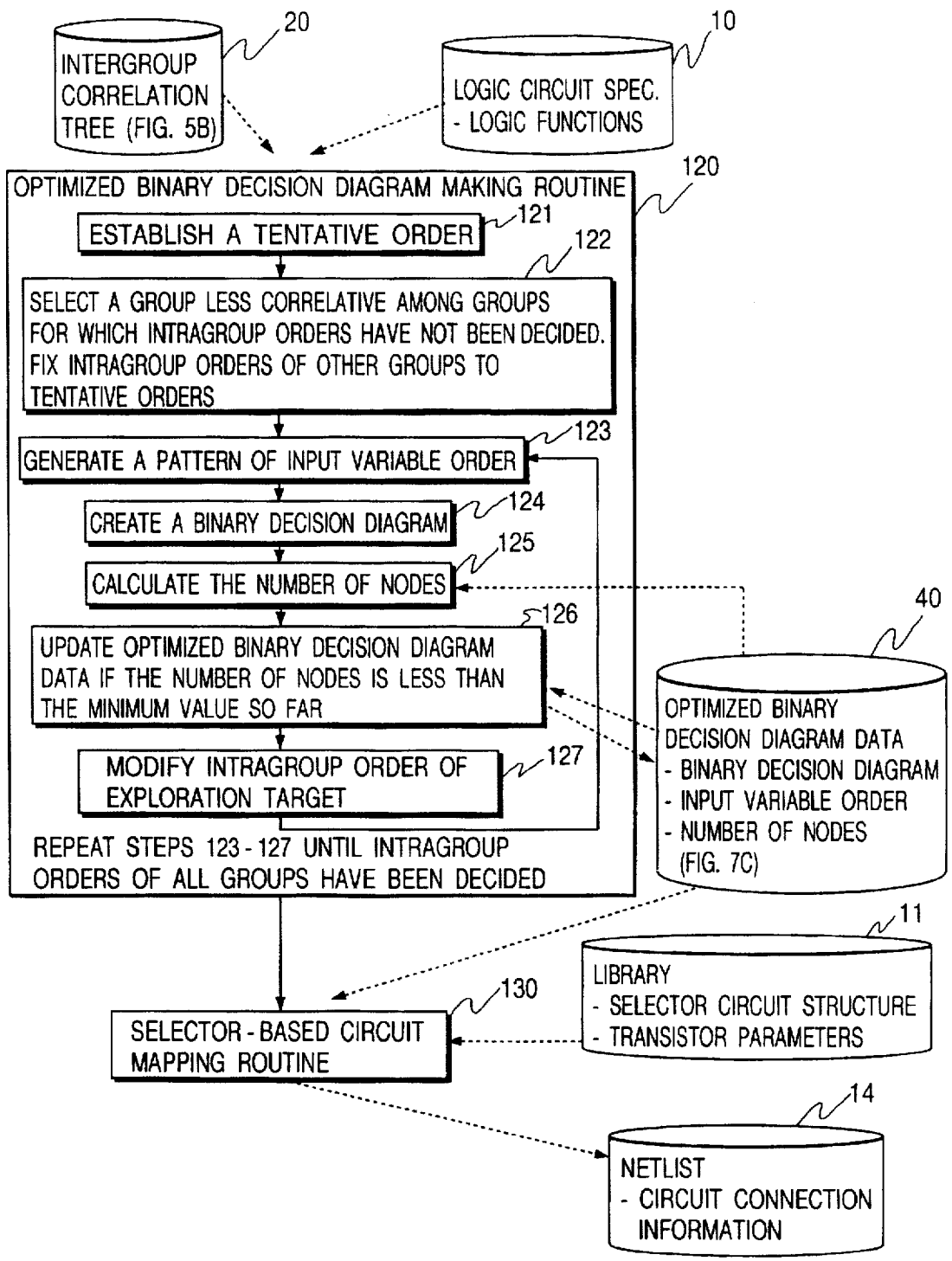
FIG. 6 is a flow chart showing an optimized binary decision diagram generating routine for use in the logic circuit generating program shown in FIG. 1.

Now referring to FIG. 6, the intragroup order between the members of each group in the intergroup correlation tree 20 is fixed in a tentative order (121). Then the group of the weakest correlation among groups registered in the intergroup correlation tree 20 is selected for the exploration object for exploring the optimized binary decision diagram within a group. At this time the intragroup orders of the groups other than the exploration object is left as is fixed in the previously determined tentative order (122). If the intergroup correlation tree 20 comprises structure shown in FIG. 5b, G3 is selected as the exploration object since G3 is the group of the weakest correlation 0, and the intragroup order of the G1 and G2 are fixed.

Next the order of input variables is produced (123). At this time, in the relation between the intergroup correlation tree 20 and the order of input variables, we presume that the leftmost input variable in the intergroup correlation tree 20 is located at the topmost position in the order of the input variables (the rightmost input variable may be positioned at the topmost position of the order, on the contrary). For example, if the intergroup correlation tree 20 has structure as shown in FIG. 5b, the order of input variables A, B, C, D, E will be produced. A binary decision diagram is produced from this order of input variables (124), and the number of nodes is counted (125). The counted number of nodes is compared with the minimum value of number of nodes retained as the optimized binary decision diagram data 40. If the number of nodes is less than the minimum then the binary decision diagram, an order of input variables, and its number of nodes in the optimized binary decision diagram data 40 will be updated (126) by the data relating to the binary decision diagram generated at this time (i.e., the diagram, an order of input variables, and the number of nodes). The default value of the optimized binary decision diagram data 40 should be predetermined to be such that the data relating to the binary decision diagram generated first is always registered.

Thereafter, the intragroup order of input variables of the exploration object is changed from one to another (127) and the steps 123 to 127 are repeated for all the patterns of the intragroup order of input variables generated by modification of the intragroup order of that exploration object. By doing this, the data retained as the optimized binary decision diagram data 40 after the optimized binary decision diagrams for all the patterns of the intragroup order of input variables in the group under exploration has been explored is the data indicating the optimized binary decision diagram for the group under exploration. In the following process, the intragroup order specified by the order of input variables contained in the data is used as a fixed intragroup order of the group. The exploration of the binary decision diagram as described above (steps 122 to 127) will be iteratively repeated for different groups until intragroup orders of all of the groups will have been explored. For the repetition, groups are selected one by one such that the group of the weakest correlation among the groups registered in the intergroup correlation tree 20 but not explored is selected for the next object.

Figure 7A:
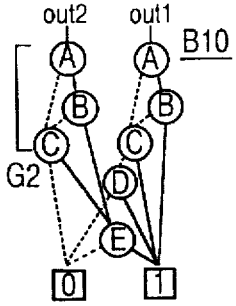
FIG. 7a is an example of a binary decision diagram generated by the optimized binary decision diagram generating routine shown in FIG. 6.
Figure 7B:
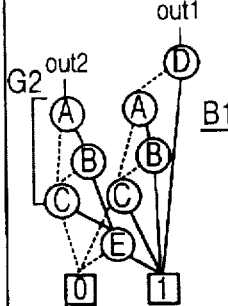
FIG. 7b is another example of a binary decision diagram generated similarly.

In the present example, the group G3 (G2, D, E) is first selected as the exploration object. There are six patterns for the intragroup order of the group G3 (G2, D, E). The order of input variables A, B, C, D such that the group G2 comes to the head position is selected as an order to be evaluated first. As the binary decision diagram for this order is produced first, the data for this diagram, i.e., the binary decision diagram B10, order of input variables, and number of nodes 8 shown in FIG. 7a are registered in the optimized binary decision diagram data 40. Thereafter, the intragroup order is modified. If the intragroup order of the group G3 is modified to D, G2, E0 then the corresponding order of input variables will be D, A, B, C, E. Accordingly the binary decision diagram will be the diagram B11 of FIG. 7b and the number of nodes is 8. This number of nodes is not less than the number of nodes registered in the optimized binary decision diagram data 40 so that the optimized binary decision diagram data 40 will not be updated. Then the intragroup order of the group G3 is modified to D, E, G2, then the corresponding order of input variables will become D, E, A, B, C. The binary decision diagram will be the diagram B12 of FIG. 7c and its number of nodes is 5, therefore the optimized binary decision diagram data 40 will be updated with the new data for this diagram. The similar process will be repeated. In the example, if the intragroup order of the group G3 is E, D and G2, the number of nodes will be 5. So, there are two options for the optimized binary decision diagram which may be obtained by modifying the intragroup order of the group G3. However, in the present embodiment the order D, E, G2 which is evaluated first among various intragroup orders will be retained in the optimized binary decision diagram data 40, as the intragroup order generating the optimized binary decision diagram. Therefore, when the exploration in the group G3 is terminated, the intragroup order of G3 is fixed to D, E, G2. Also the optimized order of input variables at this time will be D, E, A, B, and C.

At the time the intragroup order of the group G3 is determined, the group G2 is selected for the next object to be explored, because the correlation of this group G2 is 3, and is the weakest among groups not yet explored. As the group G2 is composed of the group G1 and an input variable C, there are two intragroup orders to be explored. The binary decision diagram for the order in which the group G1 is positioned before the input variable C is the already explored diagram B12 of FIG. 7c. Therefore, the optimized binary decision diagram data 40 is not updated. The binary decision diagram for the order in which the group G1 is positioned after the input variable C is the diagram B13 of FIG. 7c, and the number of nodes is five, thus the optimized binary decision diagram data 40 is not updated. As such, at the time the exploration for the group G2 is terminated, the intragroup order for this group will be left to be the order G1, C, which is the same as one tentatively determined in the process 121 for the group G2.

Figure 7C:
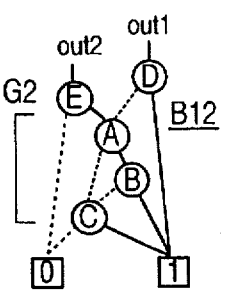
FIG. 7c is still another example of a binary decision diagram generated similarly.

Finally for the intragroup order of the group G1, the number of nodes does not change even if the intragroup order is changed. Therefore, the optimized binary decision diagram data 40 remains to be the data for the diagram B12 of FIG. 7c. Thus, the diagram B12 of FIG. 7c is determined as an optimum diagram for the logic function presumed.

(4) Selector-based circuit mapping routine 130

This routine produces a logic circuit of interest and generates a netlist 14 indicating the logic circuit, by substituting each node of the binary decision diagram specified by the optimized binary decision diagram data 40 produced by optimized binary decision diagram generating routine 120 by a unit circuit such as a selector or an inverter, and by further inserting buffer circuits for current amplification, if necessary.

To synthesize a logic circuit by substituting each node of a binary decision diagram by a unit circuit, different mapping is performed for different node types according to a known mapping rule. If the 1-edge and 0-edge of a node are not connected to a constant signal 1, 0, respectively, like the node N1 shown in the row 'a' of FIG. 8, a selector S0 having 2 inputs and 1 noutput is assigned to the node of the binary decision diagram. An input variable X corresponding to the node of the binary decision diagram is assigned to the control signal input of the selector S0, and the output of the node connected to the 1-edge is assigned to the input in1 which is selected when the control signal input is set to 1. The output of the node connected to the 0-edge is assigned to the input in0 which is selected when the control signal input is set to 0. By executing the substitution in such a manner, a circuit having the same logic function as the node in the binary decision diagram will be achieved.

Figure 8:
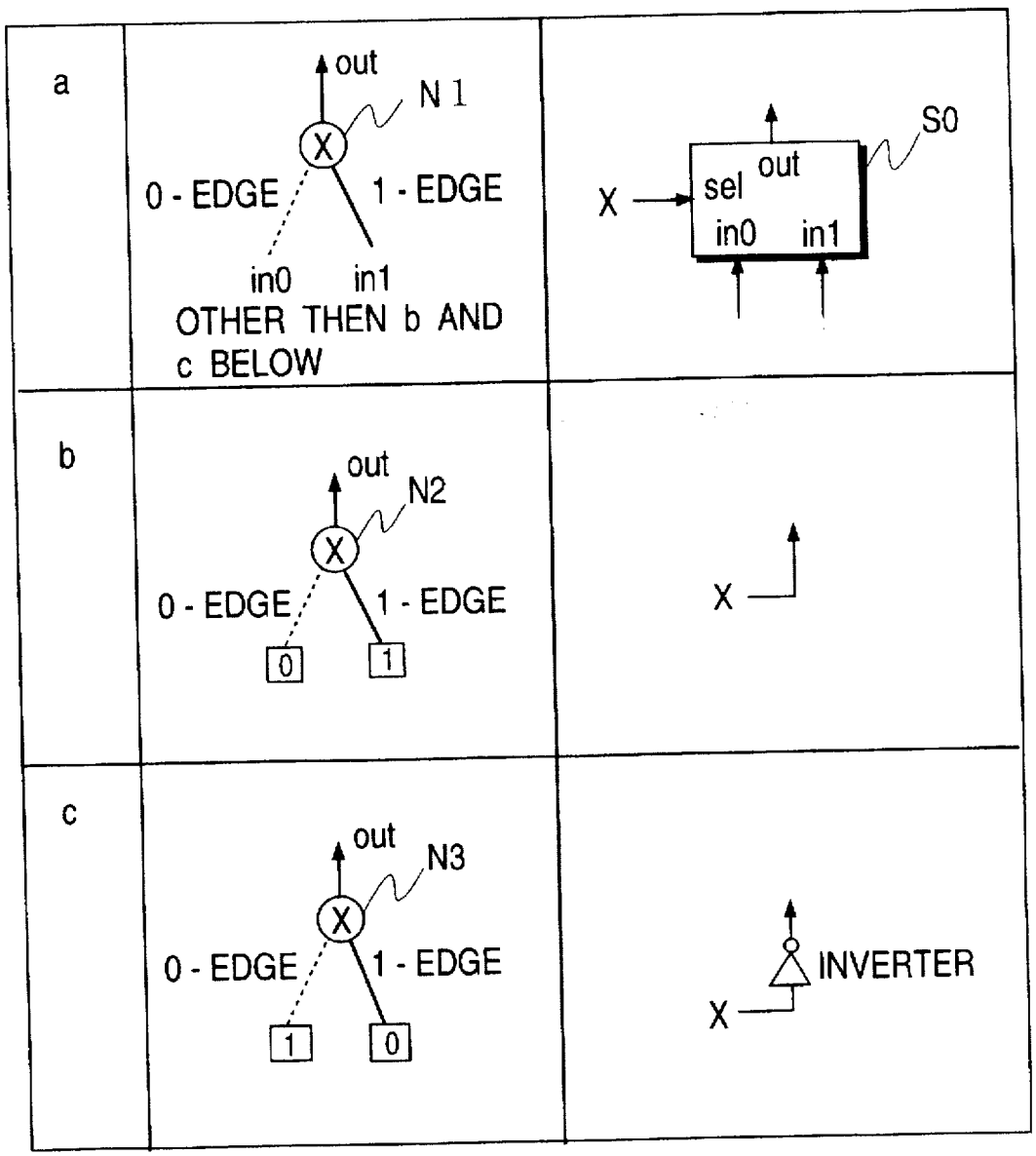
FIG. 8 is a schematic diagram showing a circuit mapping rule used by the selector-based circuit mapping routine shown in FIG. 1.

If the 1-edge of the node of the binary decision diagram is connected to 1, and the 0-edge is connected to 0, such as the node N2 shown in the row 'b' of FIG. 8, then the output of the node is 1 if the input variable X of this node is 1, and is 0 if the input variable X is 0. Since the input variable X and the output of the node have the same logic value, the input X is just passed to the next stage for this node.

Also, if the 1-edge of the node of the binary decision diagram is connected to 0, and the 0-edge is connected to 1, such as the node N3 shown in the row 'c' of FIG. 8, then the output of the node is 1 if the input variable X of this node is 0, and is 0 if the input variable X is 1. Since the output signal is the inverted signal of the input variable X, the input X is inverted by an inverter to supply to the next stage.

Figure 10A:
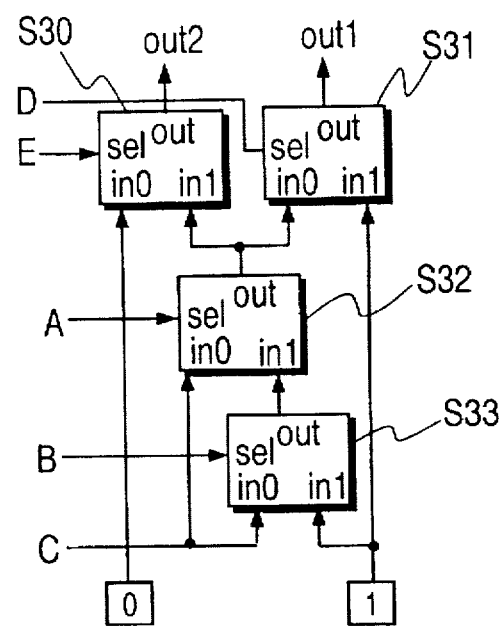
FIG. 10a is a selector level circuit diagram of the logic circuit synthesized from the optimized binary decision diagram shown in FIG. 7c.

For example, by synthesizing a logic circuit from the binary decision diagram B12 of FIG. 7c, a logic circuit of a selector level composed of selectors S30 to S33 as shown in FIG. 10a is synthesized. In the binary decision diagram B12 of FIG. 7c, the node corresponding to the input variable C corresponds to the row 'b' of FIG. 8, and other nodes correspond to the row 'a' of FIG. 8. There is no mapping corresponding to the row 'c' of FIG. 8.

Figure 9A:
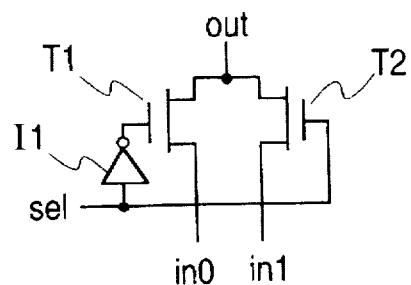
FIG. 9a is a circuit diagram of a selector circuit of pass transistor type structured by N-type field effect transistors (FETs)
Figure 9B:
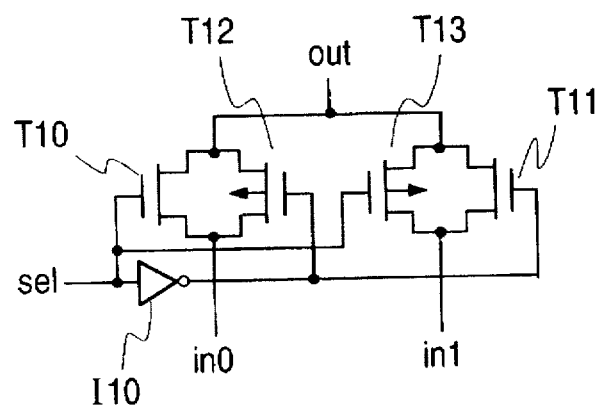
FIG. 9b is a circuit diagram of a selector circuit of pass transistor type structured by N- and P-type FETs.
Figure 9C:
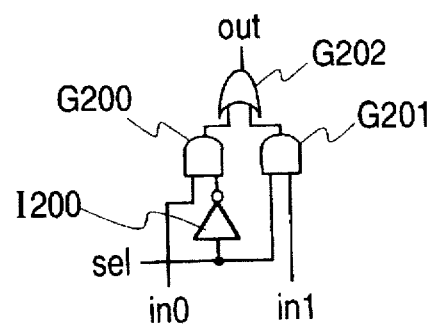
FIG. 9c is a circuit diagram of a selector circuit structured by CMOS circuit.

Next, each selector circuit of the logic circuit of a selector level thus generated is translated into a circuit of a transistor level. A variety of circuits may be conceivable for the selector circuit S0, but there are tree typical examples as follows: First, a circuit of a pass transistor type composed of N-type field effect transistors comprising N-type field effect transistors T1 and T2, and inverter I1 as shown in FIG. 9a. Second, a pass transistor type circuit composed of both P- and N-type transistors comprising N-type field effect transistors T10 and T11, P-type field effect transistors T12 and T13, and inverter I10, as shown in FIG. 9b. Third, a circuit composed of CMOS circuit comprising AND gates G200 and G201, OR gate G202, and inverter I200, as shown in FIG. 9c.

As can be seen, plural embodiments may be conceivable for the selector circuit S0, but the selector circuit structure contained in the library 11 indicates which type of selector circuit is used. By modifying this selector circuit structure, other type of selector circuit may be selected.

A logic circuit may be completed by inserting a buffer circuit for current amplification if necessary. The selector-based circuit mapping routine 130 will be terminated by outputting a netlist expressing the circuit connection information on this logic circuit.

Figure 10B:
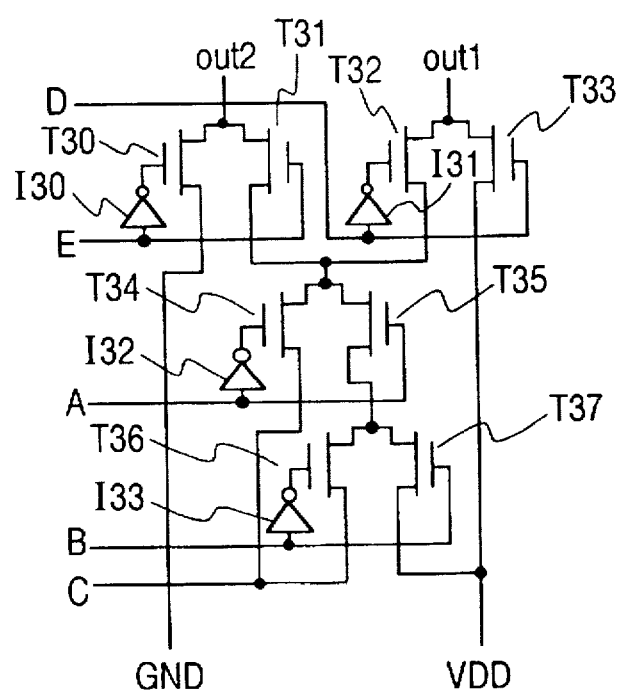

For example, in the logic circuit at the selector level of FIG. 10a, if the selector circuit is realized with the pass transistor type structured by the N-type field effect transistors of FIG. 9a, a transistor circuit shown in FIG. 10b will be finally obtained which is comprised of transistors T30 to T37, and inverters I30 to I33. In case of a circuit shown in FIG. 10b, no buffer for current amplification is used.

As described above, according to the synthesis method of generating the intergroup correlation tree 20 in this embodiment, groups are such arranged that different groups of input variable which will decrease the number of nodes if arranged nearer to each other in the order of input variables belong to the same level or levels near to each other. Groups are further arranged so that groups which need not be placed near to each other are at levels far away from each other. It is effective to decide the group hierarchy such that these conditions are satisfied. That is, as a result, in view of the characteristics of the binary decision diagram (see 1-1 of the prior art), a probability will be low that the patterns of the order of input variables not satisfying the framework of the intergroup correlation tree, i.e., the order of input variables which will not be explored by the exploration based on the intergroup correlation tree may produce a binary decision diagram of a smaller number of nodes, as compared with the number of nodes of the binary decision diagram explored by the exploration based on the intergroup correlation tree. In other words, it can be expected that the order of input variables required to generate a binary decision diagram of a small number of nodes is within a variety of orders of input variables generated by modifying the intragroup orders of the groups of the intergroup correlation tree.

Figure 7D:
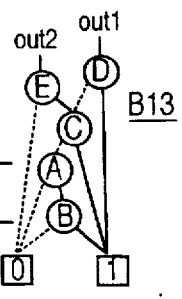
FIG. 7d is still another example of a binary decision diagram generated similarly.
Figure 7E:
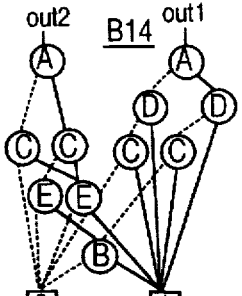
FIG. 7e is an example of a binary decision diagram not explored by the optimized binary decision diagram generating routine shown in FIG. 6.

In practice, even in the present embodiment, generation of a binary decision diagram from the order of input variables A, D, C, E, B, which is never generated by the modification of the intragroup orders of the groups of the intergroup correlation tree, merely results in the diagram B14 in FIG. 7e, which is a binary decision diagram of such a very large number of nodes as eleven. The number of nodes 11 is greater than the maximum value of number of nodes, 8, found in the exploration of the optimized binary decision diagram generating routine 120 of the present embodiment. From this, it can be expected that there is a rare possibility in failing to explore a binary decision diagram of a smaller number of nodes, even when the exploration range is limited to one which satisfies the framework of the intergroup correlation tree. Accordingly it can be expected that the method of the present invention is effective enough for exploration of a binary decision diagram having a smaller number of nodes.

In the present embodiment, the correlation is defined such that a group of input variables becomes a group of stronger correlation, when it is more suitable to arrange the group in proximity to each other in the order of input variables to obtain a binary decision diagram of a small number of nodes. Accordingly, if the correlation is thus defined, it may be anticipated that changing of the intragroup order for that group will not result in significant variation of the number of nodes Actually in this embodiment, the only group in which the number of nodes varies by the change of intragroup order was G3 of correlation 0. The number of nodes of the group G1 of correlation 4 and the group G2 of correlation 3 remained to be the minimum value 5, even when the intragroup order was changed. From this also, it can be expected that there will be no problem in almost all of the cases even if exploration of a binary decision diagram of a small number of nodes is limited to the range such that the intragroup order is changed beginning with the group of the weakest correlation in the intergroup correlation tree.

From the two reasons described above, it can be expected that a binary decision diagram of a sufficiently small number of nodes may be found from the exploration range limited such that a binary decision diagram of a smaller number of nodes is explored by changing the intragroup order from the group of the weakest correlation, with the intragroup order of other groups of higher correlation being fixed.

Even if the binary decision diagram of the minimum number of nodes is explored by exhaustive exploration for an example of a logical function of the present embodiment, the obtained smallest number of nodes will be the same 5 as that obtained in the limited exploration according to the present embodiment. Accordingly, in the present embodiment, the binary decision diagram of the minimum number of nodes has been explored with exploration executive times (6+2+2=10 times) much less than those required for the exhaustive exploration (5!=120 times).

In the present embodiment, a binary decision diagram of a small number of nodes is obtained without a fail, because the present embodiment decides the order of input variables such that the number of nodes actually decreases, by generating a binary decision diagram, rather than deciding the order of input variables with a simple rule described in the reference 6 of the prior art. Furthermore, the present embodiment does not have a problem of the reference 7 of the prior art that the result of exploration largely depends on the tentative order of input variables defined at the beginning exploration. On the other hand, when the present embodiment was applied also to some logic functions other than one used in the present embodiment, a binary decision diagram of a smaller number of nodes than the method described in the references 6 and 7 of the prior art was obtained.

As can be seen, in the present embodiment a binary decision diagram of a sufficiently smaller number of nodes may be obtained in a realistic period of time, with significantly fewer exploration execution times than the exhaustive exploration. This allows an excellent logic circuit having a logic function of interest with fewer transistors to be synthesized with highly effective exploration.

[Modification of the first embodiment]

(1) In the first embodiment, only one optimized binary decision diagram is selected for the clarity of explanation. However in the present embodiment, as described above, the diagram B13 of FIG. 7d may also be an optimized binary decision diagram. When plural binary decision diagrams of the minimum number of nodes exist, these plural diagrams of the minimum number of nodes may be selected as the optimized binary decision diagrams. One of these plural optimized binary decision diagrams may be selected based on the evaluation other than the number of nodes. For example, a logic circuit may be synthesized from each of these binary decision diagrams in a similar manner to the method of the second embodiment described below. In addition, one of or combination of plural predetermined characteristics such as an area and delay of respective logic circuits may be evaluated in a similar manner to the methods described in the second and third embodiments below. From the results of evaluation, one binary decision diagram which may synthesize a better circuit may be selected out of these plural binary decision diagrams. By adding such selection to the first embodiment, a logic circuit of having smaller number of nodes and relatively better circuit characteristics can be synthesized. The second and third embodiments described below are effective in synthesizing a logic circuit which is superior with respect to the one or plural circuit characteristics, rather than in decreasing the number of nodes.

(2) A similar intergroup correlation tree may be synthesized by using methods other than the intergroup correlation tree generating routine described in the first embodiment above. For example, a multiple decision tree may be produced which has a node for each of gates, an edge for the input line of the gate, and an output for the root, from the tentative synthesis circuit netlist 22. An intergroup correlation tree is obtained, by assigning correlation to each of nodes such that nodes nearer the root have weaker correlation, if only one output exists. In this method, if there are plural outputs, a multiple decision tree is generated having plural roots. In this case a new node having edges toward plural roots is created. If some edges are looped in the obtained multiple decision tree, then these are replaced with one edge. Thereafter the intergroup correlation tree is obtained by assigning the correlation to each node such that the node nearer the root has weaker correlation, in the manner similar to the case where there is only one output.

(3) The optimized binary decision diagram data generating routine described in the first embodiment may also be applied to diverse variations of the binary decision diagram such as a binary decision diagram with negative edges, which has attribute representative of negative operation added. This is because these variations of binary decision diagrams also have the characteristics described in 1-1 and 1-2 of the prior art in a manner similar to the original type of the binary decision diagram.

[The second embodiment]

The present embodiment is different from the first embodiment, in that it explores a binary decision diagram forming a logic circuit of small delay, instead of exploring a binary decision diagram of a small number of nodes by the first embodiment. Thus, the second embodiment is different from the first embodiment in the concrete processing of optimizing of the optimized binary decision diagram generating routine 120, and different from the first embodiment in that delay constraint information describing delay of input signals, etc. Load information describing loads connected to outputs are included in the logic circuit specification 10. These delay constraint information and load information are ones extracted by determining the wiring length from the layout data 13 generated by the automatic layout program 160 in FIG. 2.

Figure 11:
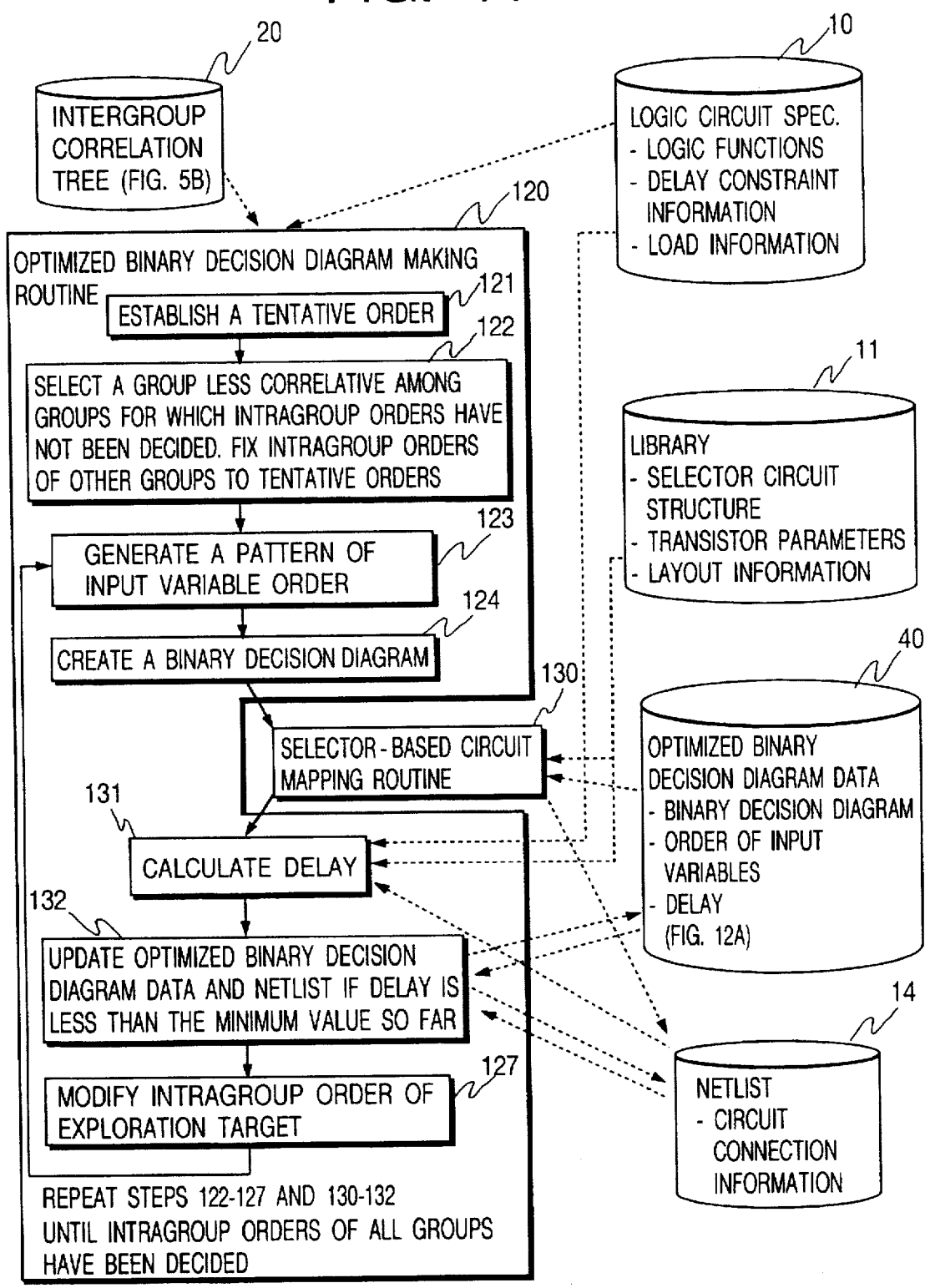
FIG. 11 is a flow chart of an optimized binary decision diagram generating routine for synthesizing a logic circuit of small delay according to the second preferred embodiment of the present invention.

Referring now to FIG. 11, the optimized binary decision diagram generating routine 120 of the present embodiment generates a binary decision diagram by performing the process 121 through 124, similar to the first embodiment (124). The present embodiment differs from the first embodiment thereafter, in that the selector-based circuit mapping routine 130 is called to synthesize a netlist 14 of the logic circuit, and to add information on the delay of input signals and information on the load connected to the outputs, both of which are included in the logic circuit specification 10, and to calculate the delay of the circuit (131). The optimized binary decision diagram data 40 will be updated when a binary decision diagram is explored which generates a logic circuit for which calculated delay becomes smaller than the delay in this data 40 (132), unlike the first embodiment where the optimized binary decision diagram data 40 is updated when a binary decision diagram is explored in which the number of nodes is smaller than the number of data in this data 40. This step differs from the first embodiment. The intragroup order of the groups already explored will be fixed to the order corresponding to the order of input variables in the optimized binary decision diagram data 40 corresponding to the minimum delay. Thereafter, as the present embodiment is similar to the first embodiment, steps 123 to 127 and steps 131 to 132 are iteratively repeated, until exploration of a group under exploration terminates. When the exploration terminates, the above steps are repeated for other groups. The above processing leads to a logic circuit with small delay, and a corresponding optimized binary decision diagram.

The calculation of delay in step 131 will be explained in greater details with reference to the same logic function as used in the first embodiment. Here, input variables D, E, B are significantly delayed from other input variables A, C, and further, the amount of delay is assumed to be approximately equal in D, E, B. As the circuit of a transistor level finally synthesized in the first embodiment is one shown in FIG. 10b and delay from B will be the greatest. Thus, the amount of delay of this whole circuit D1:

$D1$=delay of input $B$+delay of 3 Tr. stages+load delay of out1 (or load delay of out2)

Figures 12A, 12B:
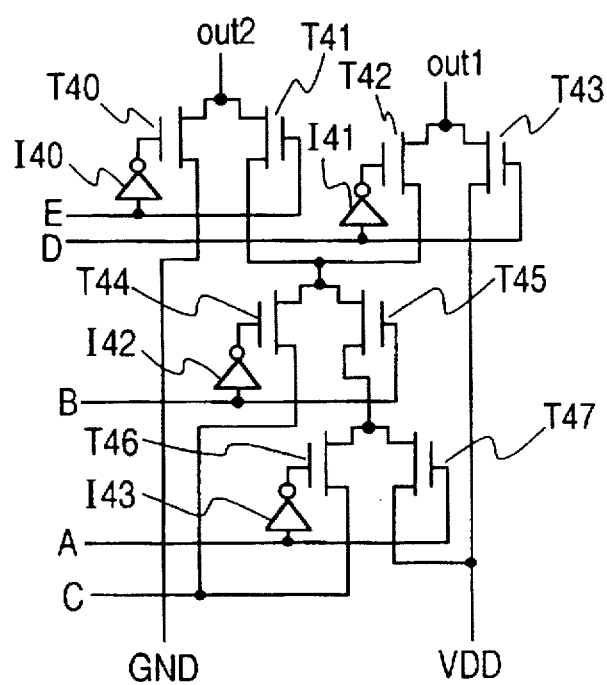

Among binary decision diagrams for the present logic function, there are plural binary decision diagrams which have the same node number 5 as one finally selected as the optimized binary decision diagram B12 shown in FIG. 7C. One of them is a diagram B15 shown in FIG. 12a. When a logic circuit is synthesized from the binary decision diagram B15 of FIG. 12a, the circuit shown in FIG. 12b will be derived, which is comprised of transistors T40 to T47 and inverters I40 to I43. The delay of this circuit D2 will be:

$D2$=delay of input $B$+delay of 2 Tr. stages+load delay of out1 (or load delay of out2)

thus the delay is one transistor stage smaller than the circuit of FIG. 10b. Accordingly, the present embodiment is allowed to synthesize a logic circuit of smaller delay as shown in FIG. 12b, by synthesizing a logic circuit, calculating delay and updating an optimized binary decision diagram such that delay becomes smaller.

Thus, the above processing makes it possible to effectively explore a binary decision diagram which generates a logic circuit with smaller delay, and to synthesize a logic circuit with such characteristics.

[The third embodiment]

The present embodiment explores a binary decision diagram which will make an area of a synthesized logic circuit be smaller, unlike the second embodiment above.

Figure 13:
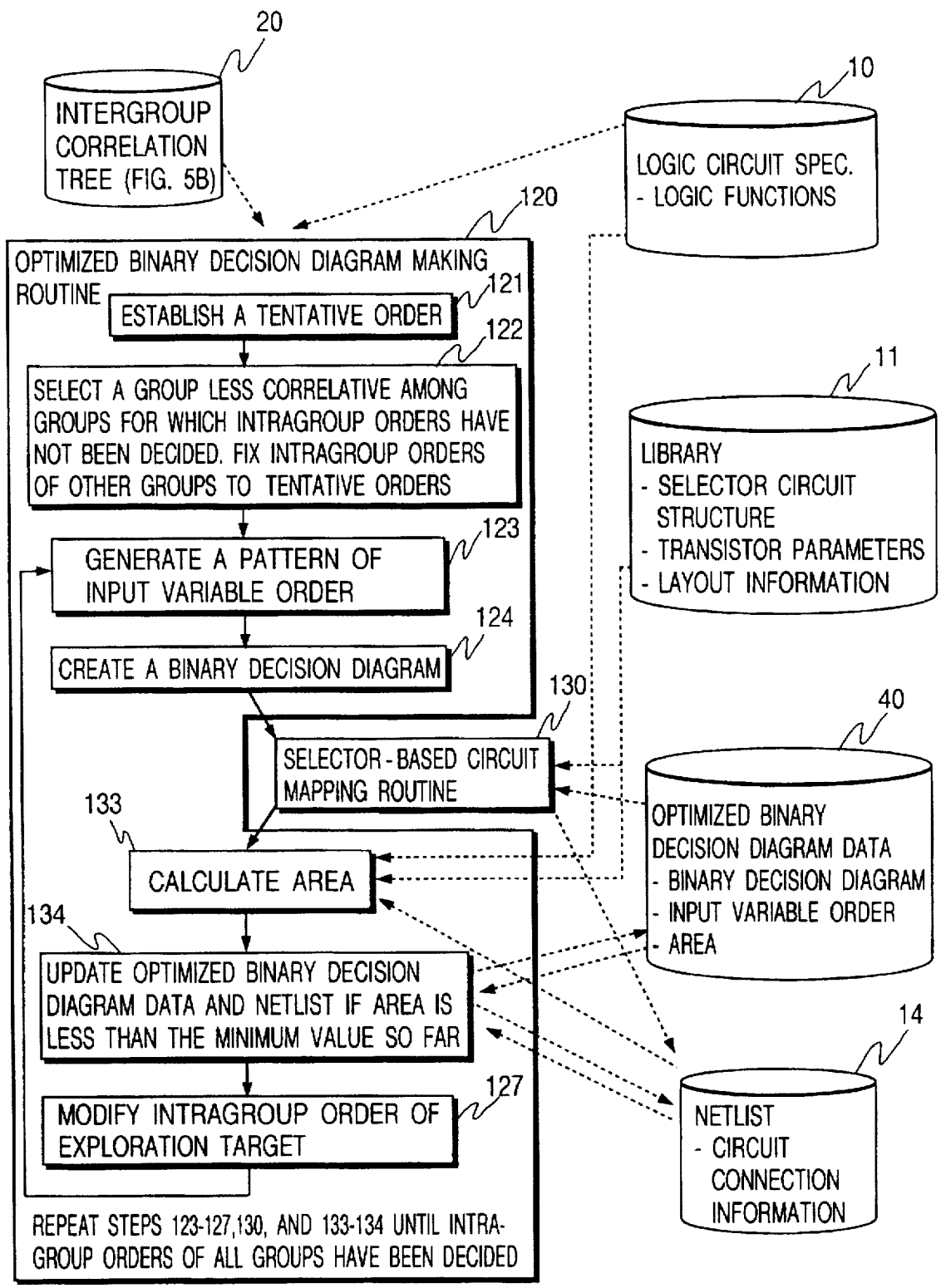
FIG. 13 is a flow chart of an optimized binary decision diagram generating routine for synthesizing a logic circuit of a smaller size according to the third preferred embodiment of the present invention.

Referring now to FIG. 13, the optimized binary decision diagram generating routine 120 of the present embodiment generates a binary decision diagram by performing steps 121 through 124, as in the second embodiment, and then calls the selector-based circuit mapping routine 130 for synthesizing the netlist 14 of logic circuit corresponding to the generated binary decision diagram. Thereafter, unlike the second embodiment, the present embodiment reads from the layout information of the library 11, information on how much area is occupied actually on the layout by the transistors and selector circuits, and calculates the area of the synthesized logic circuit (133). The optimized binary decision diagram data 40 will be updated if the calculated area is smaller than the data stored in the diagram data 40, and not updated otherwise(134). The intragroup order of the explored group will be fixed to one corresponding to the order of input variables of the optimized binary decision diagram explored for the minimum area. Thereafter, above processing will be iteratively repeated, like in the first and second embodiments.

Thus, the above processing makes it possible to effectively explore a binary decision diagram which will generate a logic circuit with a smaller area, regardless of whether or not a buffer circuit is inserted for current amplification, and to synthesize a logic circuit with such characteristics.

[The fourth embodiment]

In the present embodiment, a binary decision diagram is explored for optimizing combination of area, delay, and power consumption of the synthesized logic circuit unlike the first to third embodiments.

Figure 14:
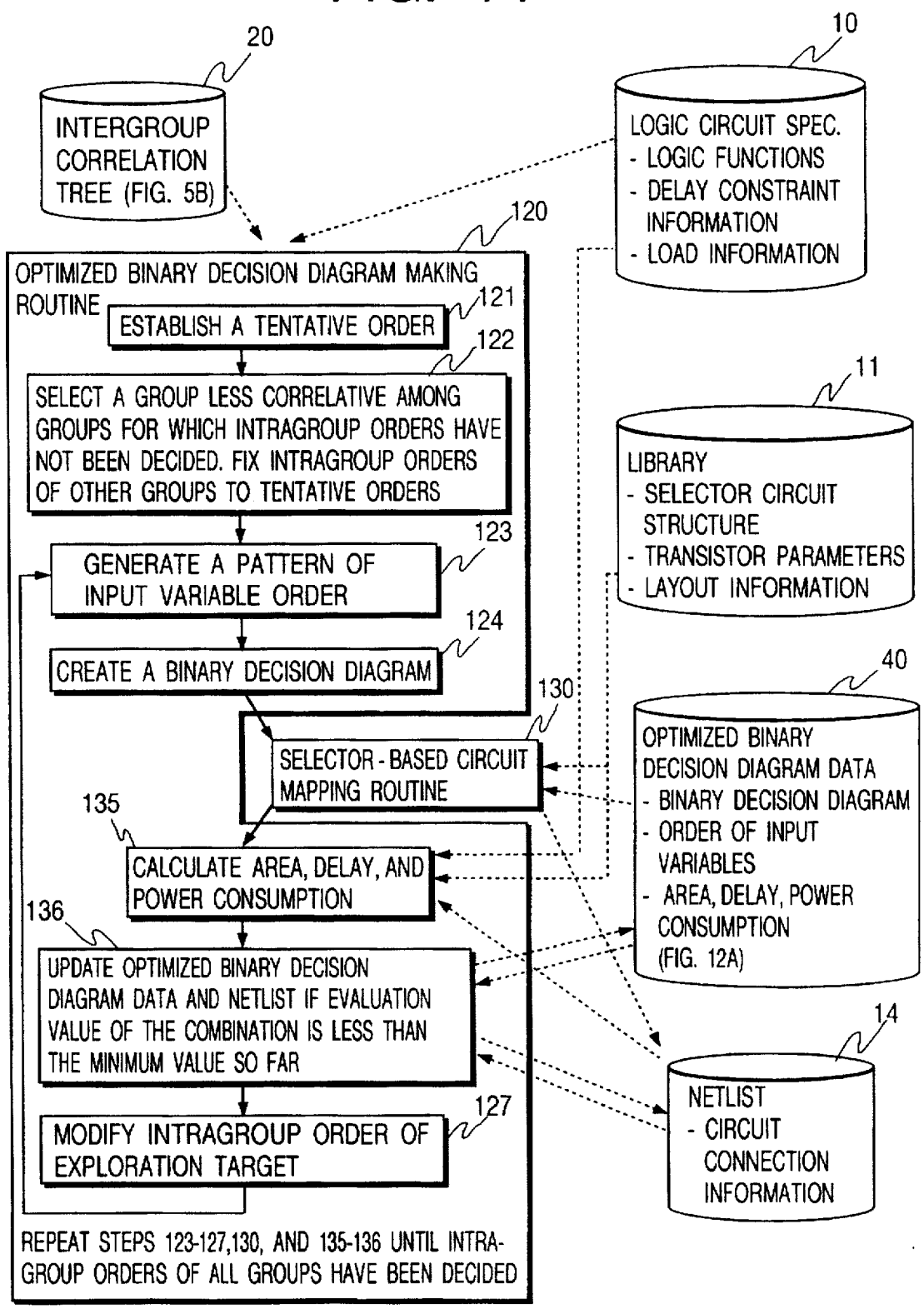
FIG. 14 is a flow chart of an optimized binary decision diagram generating routine for optimizing the combination among a size, delay and power consumption according to the fourth preferred embodiment.

Referring to FIG. 14, the optimized binary decision diagram generating routine 120 of the present embodiment calls the selector-based circuit mapping routine 130 after processing 121 through 124, similar to the second and third embodiments, and synthesizes a netlist 14 of the logic circuit corresponding to the generated binary decision diagram. Then, in the present embodiment, unlike the second and third embodiments, the area, delay, and power consumption of that circuit are calculated by using the parameters of transistors and layout information both stored in the library 11, delay information of input signals included in the logic circuit specification 10, and information of the load connected to the outputs (135). The optimized binary decision diagram data 40 will be updated if the calculated combination of area, delay and power consumption is better than the combination included in the data 40 (136). The optimization of the combination of area, delay and power consumption will be determined whether a value of an evaluation function using the area, delay, and power consumption as parameters, is smaller or not. For example, if the evaluation function is given as:

evaluation function=area×delay×power consumption, then the weight of these three items will be considered as equal, so it is expected that a circuit with well combined these three items will be obtained. By modifying items in the function, we can give priority combination of to either an area, or delay, or an area and power consumption, or so.

The intragroup order of an explored group will be fixed to one corresponding to the order of input variables of the optimized binary decision diagram corresponding to the logic circuit with optimized combination. Thereafter, above processing will be iteratively repeated as in the first to third embodiments above.

Thus, the above processing makes it possible to effectively explore a binary decision diagram which will generate a logic circuit with combination of area, delay, and power consumption being optimized, to synthesize a logic circuit with such characteristics.

[Modification of the fourth embodiment]

It is possible to modify the fourth embodiment so as to explore a binary decision diagram which will generate a logic circuit with only some part of the combination of area, delay and power consumption, such as the combination of delay and area. The modification makes it possible to effectively explore such a binary decision diagram, and to synthesize a logic circuit with such characteristics.

As can be understood from the embodiments described above, according to the present invention, a binary decision diagram which satisfies a predetermined condition can be effectively explored in real time, from a given logic circuit specification. Especially, a binary decision diagram with enough a small number of nodes can be effectively explored. Therefore, a compact logic circuit with a smaller number of transistors can be synthesized.

In addition, a binary decision diagram which can be used for synthesizing a logic circuit with small delay can be effectively explored, and a logic circuit with such characteristics can be synthesized.

Furthermore, a binary decision diagram which can be used for synthesizing a logic circuit optimized with either a small area, or with combination of part or all of area, delay, and power can be effectively explored consumption, and a logic circuit with such characteristics can be synthesized.

What is claimed is:

1. A method of synthesizing a logic circuit by a computer system, based on a logic function defining relationship between a group of input variables representative of a group of input signals of a logic circuit to be synthesized and at least one output variable representative of an output signal of the logic circuit, the method comprising steps executed by the computer system, the steps including:

(a) determining a plurality of groups arranged in a hierarchy, based on the logic function, so that the hierarchy reflects hierarchical structure of strength of logical correlation between the group of input variables;

a relatively upper group among said plurality of groups including members having relatively weak correlation with each other;

a member of each group being one group one level lower than said each group or one input variable which does not belong to any of one or plural groups lower than said each group;

(b) sequentially selecting said plurality of groups from the uppermost group;

(c) determining an intragroup order of members of one of the groups so as to satisfy a predetermined condition, each time when the one group is selected in the step (b);

(d) determining a binary decision diagram corresponding to the order of said group of variables as a binary decision diagram for said logic function;

said order being one determined by a plurality of intragroup orders respectively determined as a result of execution of said step (c) to said plurality of groups; and (e) mapping the determined binary decision diagram into a logic circuit and outputting the logic circuit obtained by said mapping as a logic circuit for said logic function.

2. A method of synthesizing a logic circuit according to claim 1:

wherein the lowermost group in said plurality of groups includes, as members, part of said group of input variables which have relatively strong correlation with each other;

wherein each of plural groups upper than said lowermost group includes, as a member, at least one input variable which does not belong to any of one or plural groups lower than said each group and which has relatively strong correlation to a group one level lower than said each group.

3. A method of synthesizing a logic circuit according to claim 2:

wherein said intragroup order determined in said step (c) for each of said plurality of groups is an order between one or plural input variables belonging to said each group and one or plural groups one level lower than said each group, when said each group is not a lowermost group, and said each intragroup order is an order of plural input variables belonging to said each group when said each group is a lowermost group;

wherein said step (c) is performed based on an intragroup order already determined by the step (c) for an upper group than the selected group if the upper group exists, and based on one or plural intragroup orders respectively predetermined for one or plural groups lower than said selected group if said one or plural lower groups exist.

4. A method of synthesizing a logic circuit according to claim 1, wherein said step (a) of determining said plurality of groups comprises the steps of:

(a1) determining a lowermost group having as members a plurality of input variables which have relatively strong correlation with each other, among said group of input variables;

(a2) determining a group one level upper than said lowermost group, said one level upper group having, as members, the lowermost group and one or plural input variables which have relatively strong correlation with said plurality of input variables of said lowermost group; and (a3) repeating said step (a2) so as to determine, a further upper group having as members a group determined in said step (a2) and one or plural input variables which have relatively strong correlation with the group determined in step (a2) and which does not belong to either of groups determined in said step (a1) or (a2).

5. A method of synthesizing a logic circuit according to claim 4, wherein said step (a1) comprises the steps of:

determining a plurality of correlations from said logic function, said plurality of correlations respectively indicating strength of correlation between different two of said group of input variables; and selecting a plurality of input variables with relatively strong correlation with each other among said plurality of correlations, as members of a lowermost group.

6. A method of synthesizing a logic circuit according to claim 5, wherein said step of determining said plurality of correlations comprising the steps of:

determining, based on said logic function, a tentative logic circuit which satisfies relationship defined by said logic function among said group of input signals and said at least one output signal; and determining said plurality of correlations based on said determined tentative logic circuit, such that the number of logic gates through which two input signals pass together is a correlation between two input variables corresponding to these two input signals.

7. A method of synthesizing a logic circuit according to claim 5:

wherein said step (a2) comprises steps to be executed when said step (a2) is executed for a first time, the steps including;

determining a plurality of correlations based on said logic function, each of said plurality of correlations indicating strength of correlation between said lowermost Group and one of a plurality of input variables not belonging to said lowermost group, among said group of input variables; and selecting one or plural input variables with relatively strong correlations with said lowermost group, among said plurality of input variables not belonging to said lowermost group;

wherein said selecting step selects said one or plural input variables as members of a group one level upper than said lowermost group;

wherein said selecting step is executed based on said plurality of correlations determined for said plurality of input variables not belonging to said lowermost group;

wherein said step (a2) comprises steps to be executed when said step (a2) is repeated by said step (a3), said steps including;

determining a plurality of correlations based on said logic function, said plurality of correlations respectively indicating strength of correlation between a group determined at immediately preceding execution of said step (a2) and one of a plurality of particular input variables selected from said group of input variables;

said plurality of particular input variables being ones not belonging to any of a plurality of groups each determined either by said step (a1) or by preceding execution of said step (a2); and selecting one or plural input variables which have relatively strong correlation with the group determined at immediately preceding execution of the step (a2), among said plurality of particular input variables;

wherein said selecting step selects said one or plural input variables as members of a group one level upper than the group determined by immediately preceding execution of the step (a2);

wherein said selecting step is executed based on said plurality of correlations determined for said plurality of particular input variables.

8. A method of synthesizing a logic circuit according to claim 1, wherein said predetermined condition used in said step (c) is that an intragroup order determined in said step (c) is an intragroup order which generates a binary decision diagram with a minimum number of nodes, among a plurality of intragroup order candidates of said selected group.

9. A method of synthesizing a logic circuit according to claim 8, wherein said step (c) comprises the steps of:

changing an intragroup order of the selected group to said plurality of intragroup order candidates of said selected group from one to another;

generating a binary decision diagram representative of said logic function, each time when said intragroup order of the selected group is changed, said generating being executed based on an order of said group of input variables, as determined when said intragroup order of said selected group is changed to one of said plurality of intragroup order candidates;

counting a total number of nodes in the generated binary decision diagram;

detecting a minimum number of nodes among a plurality of numbers of nodes each counted by said counting step for said plurality of intragroup order candidates; and determining an intragroup order which has generated a binary decision diagram having the minimum number of nodes detected, as an intragroup order of said selected group.

10. A method of synthesizing a logic circuit according to claim 1, wherein said step (e) comprises a step of synthesizing logic circuit by mapping each node of said determined binary decision diagram to a selector circuit.

11. A method of manufacturing a semiconductor device, comprising the steps of:

generating a plurality of mask patterns for manufacturing a logic circuit produced according to claim 1; and manufacturing a semiconductor integrated circuit including said logic circuit by means of said plurality of mask patterns.

12. A method of synthesizing a logic circuit by a computer system, based on a logic function defining relation between a group of input variables representative of a group of input signals of a logic circuit to be synthesized and at least one output variable representative of an output signal of said logic circuit, said method comprising steps executed by said computer system, the steps including:

(a) changing an order of said group of input variables to different order candidates from one to another;

(b) generating a binary decision diagram for said logic function each time when the order of said group of input variables is changed;

(c) generating a logic circuit defined by said logic function, by mapping the generated binary decision diagram into a logic circuit;

(d) calculating a value of a predetermined circuit characteristics of said generated logic circuit;

(e) detecting a most appropriate value among a plurality of values calculated in said step (d) for said plurality of order candidates;

(f) determining an order candidate having generated a logic circuit with the detected most appropriate value, as a most appropriate order of said group of input variables; and (g) outputting a logic circuit generated in said step (c) for said determined most appropriate order, as the logic circuit to be synthesized.

13. A method of synthesizing a logic circuit according to claim 12, wherein said predetermined circuit characteristics is at least one of an area, delay, and power consumption.

14. A method of synthesizing a logic circuit according to claim 12, wherein said predetermined circuit characteristics is combination of at least two of an area, delay, and power consumption.

15. A method of synthesizing a logic circuit by a computer system, based on a logic function defining relationship between a group of input variables representative of a group of input signals of a logic circuit to be synthesized and at least one output variable representative of an output signal of the logic circuit, the method comprising steps executed by the computer system, the steps including:

(a) determining a plurality of groups arranged in a hierarchy, based on the logic function, so that said hierarchy reflects hierarchical structure of strength of logical correlation between the group of input variables;

a relatively upper group among said plurality of groups including members having relatively weak correlation with each other;

a member of each group being one group one level lower than said each group or one input variable which does not belong to any of one or plural groups lower than said each group;

(b) sequentially selecting said plurality of groups from the uppermost group;

(c) determining an intragroup order of members of one of the groups so as to satisfy a predetermined condition, each time when the group is selected in the step (b);

said predetermined condition used in said step (c) being that an intragroup order determined in said step (c) is an intragroup order which generates a binary decision diagram which can be mapped into a logic circuit which has a most appropriate value of a circuit characteristics, among a plurality of intragroup order candidates of said selected group;

(d) determining a binary decision diagram corresponding to the order of said group of input variables as a binary decision diagram for said logic function;

said order being one determined by a plurality of intragroup orders respectively determined as a result of execution of said step (c) to said plurality of groups; and (e) mapping the determined binary decision diagram into a logic circuit and outputting the logic circuit obtained by said mapping as a logic circuit for said logic function.

16. A method of synthesizing a logic circuit according to claim 15:

wherein said step (c) comprises the steps of;

changing an intragroup order of the selected group to said plurality of intragroup order candidates of said selected group from one to another;

generating a binary decision diagram representative of said logic function, each time when said intragroup order of the selected group is changed;

said generating being executed based on an order of said group of input variables, as determined when said intragroup order of said selected group is changed to one of said plurality of intragroup order candidates;

generating a logic circuit defined by said logic function, by mapping the generated binary decision diagram into a logic circuit;

calculating a value of a predetermined circuit characteristics of said generated logic circuit;

detecting a most appropriate value among a plurality of values calculated in said step (d) for said plurality of order candidates; and determining an order candidate having generated a logic circuit with the detected most appropriate value, as a most appropriate order of said group of input variables;

wherein said step (e) comprises a step of outputting, as the logic circuit to be synthesized, a logic circuit generated in the step (c) for an intragroup order of input variables determined in the step (c) for the lowermost group.

17. A method of synthesizing a logic circuit according to claim 15:

wherein the lowermost group in said plurality of groups includes, as members, part of said group of input variables which have relatively strong correlation with each other;

wherein each of plural groups upper than said lowermost group includes, as a member, at least one input variable which does not belong to any of one or plural groups lower than said each group and which has relatively strong correlation to a group one level lower than said each group.

18. A method of synthesizing a logic circuit according to claim 17:

wherein said intragroup order determined in said step (c) for each of said plurality of groups is an order between one or plural input variables belonging to said each group and one or plural groups one level lower than said each group, when said each group is not a lowermost group, and said each intragroup order is an order of plural input variables belonging to said each group when said each group is a lowermost group;

wherein said step (c) is performed based on an intragroup order already determined by the step (c) for an upper group than the selected group if the upper group exists, and based on one or plural intragroup orders respectively predetermined for one or plural groups lower than said selected group if said one or plural lower groups exist.

19. A method of synthesizing a logic circuit according to claim 15, wherein said step (a) of determining said plurality of groups comprises the steps of:
 (a1) determining a lowermost group having as members a plurality of input variables which have relatively strong correlation with each other, among said group of input variables;
 (a2) determining a group one level upper than said lowermost group, said one level upper group having, as members, the lowermost group and one or plural input variables which have relatively strong correlation with said plurality of input variables of said lowermost group; and
 (a3) repeating said step (a2) so as to determine, a further upper group having as members a group determined in said step (a2) and one or plural input variables which have relatively strong correlation with the group determined in step (a2) and which does not belong to either of groups determined in said step (a1) or (a2).

20. A method of synthesizing a logic circuit according to claim 19, wherein said step (a1) comprises the steps of:
 determining a plurality of correlations from said logic function, said plurality of correlations respectively indicating strength of correlation between different two of said Group of input variables; and
 selecting a plurality of input variables with relatively strong correlation with each other among said plurality of correlations, as members of a lowermost group.

21. A method of synthesizing a logic circuit according to claim 20, wherein said step of determining said plurality of correlations comprising the steps of:
 determining, based on said logic function, a tentative logic circuit which satisfies relationship defined by said logic function among said group of input signals and said at least one output signal; and
 determining said plurality of correlations based on said determined tentative logic circuit, such that the number of logic gates through which two input signals pass together is a correlation between two input variables corresponding to these two input signals.

22. A method of synthesizing a logic circuit according to claim 20:
 wherein said step (a2) comprises steps to be executed when said step (a2) is executed for a first time, the steps including;
 determining a plurality of correlations based on said logic function, each of said plurality of correlations indicating strength of correlation between said lowermost group and one of a plurality of input variables not belonging to said lowermost group, among said group of input variables; and
 selecting one or plural input variables with relatively strong correlations with said lowermost group, among said plurality of input variables not belonging to said lowermost group;
 wherein said selecting step selects said one or plural input variables as members of a group one level upper than said lowermost group;
 wherein said selecting step is executed based on said plurality of correlations determined for said plurality of input variables not belonging to said lowermost group;
 wherein said step (a2) comprises steps to be executed when said step (a2) is repeated by said step (a3), said steps including;
 determining a plurality of correlations based on said logic function, said plurality of correlations respectively indicating strength of correlation between a group determined at immediately preceding execution of said step (a2) and one of a plurality of particular input variables selected from said group of input variables;
 said plurality of particular input variables being ones not belonging to any of a plurality of groups each determined either by said step (a1) or by preceding execution of said step (a2); and
 selecting one or plural input variables which have relatively strong correlation with the group determined at immediately preceding execution of the step (a2), among said plurality of particular input variables;
 wherein said selecting step selects said one or plural input variables as members of a group one level upper than the group determined by immediately preceding execution of the step (a2);
 wherein said selecting step is executed based on said plurality of correlations determined for said plurality of particular input variables.

23. A method of synthesizing a logic circuit according to claim 15, wherein said predetermined circuit characteristics is an area.

24. A method of synthesizing a logic circuit according to claim 15, wherein said predetermined circuit characteristics is delay.

25. A method of synthesizing a logic circuit according to claim 15, wherein said predetermined circuit characteristics is combination of an area and power consumption.

26. A method of synthesizing a logic circuit according to claim 15, wherein said predetermined circuit characteristics is combination of an area, delay, and power consumption.

27. A method of synthesizing a logic circuit according to claim 15, wherein said step (e) comprises a step of synthesizing logic circuit by mapping each node of said determined binary decision diagram to a selector circuit.

28. A method of manufacturing a semiconductor device, comprising the steps of:
 generating a plurality of mask patterns for manufacturing a logic circuit produced according to claim 15; and
 manufacturing a semiconductor integrated circuit including said logic circuit by means of said plurality of mask patterns.

29. A method of optimizing a binary decision diagram representing a logic function which defines relationship between a group of input variables representative of a group of input signals of a logic circuit and at least one output variable representative of an output signal of the logic circuit, the method comprising steps executed by a computer system, the steps including:
 (a) determining a plurality of groups arranged in a hierarchy, based on the logic function, so that the hierarchy reflects hierarchical structure of strength of logical correlation between the group of input variables;
 a relatively upper group among said plurality of groups including members having relatively weak correlation with each other;
 a member of each group being one group one level lower than said each group or one input variable which does not belong to any of one or plural groups lower than said each group;

(b) sequentially selecting said plurality of groups from the uppermost group;

(c) determining an intragroup order of members of one of the groups so as to satisfy a predetermined condition, each time when the one group is selected in the step (b); and (d) determining a binary decision diagram corresponding to an order of said group of variables as an optimized binary decision diagram for said logic function, said order being one determined by a plurality of intragroup orders respectively determined as a result of execution of said step (c) to said plurality of groups.

30. A method of optimizing a binary decision diagram according to claim 29:

wherein the lowermost group in said plurality of groups includes, as members, part of said group of input variables which have relatively strong correlation with each other;

wherein each of plural groups upper than said lowermost group includes, as a member, at least one input variable which does not belong to any of one or plural groups lower than said each group and which has relatively strong correlation to a group one level lower than said each group.

31. A method of optimizing a binary decision diagram according to claim 30:

wherein said intragroup order determined in said step (c) for each of said plurality of groups is an order between one or plural input variables belonging to said each group and one or plural groups one level lower than said each group, when said each group is not a lowermost group, and said each intragroup order is an order of plural input variables belonging to said each group when said each group is a lowermost group;

wherein said step (c) is performed based on an intragroup order already determined by the step (c) for an upper group than the selected group if the upper group exists, and based on one or plural intragroup orders respectively predetermined for one or plural groups lower than said selected group if said one or plural lower groups exist.

32. A method of optimizing a binary decision diagram according to claim 29, wherein said predetermined condition used in said step (c) is that an intragroup order determined in said step (c) is an intragroup order which generates a binary decision diagram with a minimum number of nodes, among a plurality of intragroup order candidates of said selected group.

33. A method of optimizing a binary decision diagram according to claim 32, wherein said step (c) comprises the steps of:

changing an intragroup order of the selected group to said plurality of intragroup order candidates of said selected group from one to another;

generating a binary decision diagram representative of said logic function, each time when said intragroup order of the selected group is changed, said generating being executed based on an order of said group of input variables, as determined when said intragroup order of said selected group is changed to one of said plurality of intragroup order candidates;

counting a total number of nodes in the generated binary decision diagram;

detecting a minimum number of nodes among a plurality of numbers of nodes each counted by said counting step for said plurality of intragroup order candidates; and determining an intragroup order which has generated a binary decision diagram having the minimum number of nodes detected, as an intragroup order of said selected group.

* * * * *